(12) United States Patent
Moeller et al.

(10) Patent No.: US 9,201,722 B1
(45) Date of Patent: Dec. 1, 2015

(54) SYSTEM-ON-CHIP AND METHOD FOR SENDING DATA IN A SYSTEM-ON-CHIP

(71) Applicants: Dirk Moeller, Zorneding (DE); Peter Ludwig Limmer, Munich (DE); Clemens Alfred Roettgermann, Munich (DE)

(72) Inventors: Dirk Moeller, Zorneding (DE); Peter Ludwig Limmer, Munich (DE); Clemens Alfred Roettgermann, Munich (DE)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 14 days.

(21) Appl. No.: 14/327,675

(22) Filed: Jul. 10, 2014

(51) Int. Cl.
| | | |
|---|---|---|
| *G01R 31/08* | (2006.01) | |
| *G06M 3/00* | (2006.01) | |
| *G06F 11/07* | (2006.01) | |
| *G06F 11/10* | (2006.01) | |
| *H03M 13/09* | (2006.01) | |
| *G06M 3/08* | (2006.01) | |

(52) U.S. Cl.
CPC .......... *G06F 11/079* (2013.01); *G06F 11/0736* (2013.01); *G06F 11/1004* (2013.01); *G06M 3/08* (2013.01); *H03M 13/09* (2013.01)

(58) Field of Classification Search
CPC .... G06M 3/08; G06F 11/079; G06F 11/0736; G06F 11/1004; H03M 13/09
USPC ............ 714/819, 821, 749, 748, 751; 377/28, 377/30, 31, 39, 107
See application file for complete search history.

(56) References Cited

U.S. PATENT DOCUMENTS

| | | | |
|---|---|---|---|
| 6,728,908 B1 | 4/2004 | Fukuhara et al. | |
| 7,076,719 B2 * | 7/2006 | Anjo | H04L 1/188 714/43 |
| 2009/0327826 A1 * | 12/2009 | Inoue | H04L 1/1809 714/748 |
| 2010/0275108 A1 * | 10/2010 | Sloan | H04L 1/24 714/819 |

OTHER PUBLICATIONS

International Standard ISO/IEC, "Information technology—Generic coding of moving pictures and associated audio information: Systems," Chapter 2:4, pp. 8-50; ISO/IEC 13818-1, Second Edition, Dec. 1, 2000; 51 pages.
Profibus Nutzerorganisation E.V., "PROFIsafe System Description—Technology and Application," Section 4, Version Nov. 2010, downloaded from <<http://www.automation.com/pdf_articles/profinet/PROFIsafe_system_description_v_2010_English.pdf>> on Jul. 3, 2014, 24 pages.

* cited by examiner

*Primary Examiner* — Christine Tu (57) ABSTRACT

A system-on-chip comprising a sender unit and a receiver unit and a method of operating thereof are described. The sender unit comprises a send counter for providing a send counter value. The receiver unit comprises a receive counter for providing a receive counter value. The sender unit is arranged to increment the send counter value by an increment and send a data packet to the receiver unit. The receiver unit is arranged to receive the data packet and increment the receive counter value by the increment. In a challenge operation, the sender unit sends the send counter value to the receiver unit. In a challenge response operation, the receiver unit receives the send counter value, compares the values, and generates a comparison result. Loss of data packets from the sender unit as well as reception of unexpected data packets from a third functional unit may thus be detected.

10 Claims, 4 Drawing Sheets

SYSTEM-ON-CHIP AND METHOD FOR SENDING DATA IN A SYSTEM-ON-CHIP

FIELD OF THE INVENTION

This invention relates to a system-on-chip, SoC, and to a method for sending data in an SoC.

BACKGROUND OF THE INVENTION

A system-on-chip (SoC) is a computer system implemented in a single integrated circuit. An SoC may comprise various functional units such as a central processing unit (CPU), memory units, digital signal processors, or other integrated peripherals. The various functional units may be interconnected by suitable signal lines, e.g., by a data bus that may be shared among the functional units. A functional unit may be arranged to send data to another unit of the same system-on-chip. A functional unit that sends data and a functional unit that receives data may be referred to as a sender unit, or sender, and as a receiver unit, or receiver, respectively. A functional unit may be a hardware component or a software component of the SoC, or a combination of hardware and software. For example, two program instances running on a processor unit of the SoC may be considered distinct functional units.

A sender unit may be arranged to send data to a receiver unit in the form of successive data packets. A data packet is a bit sequence, that is a sequence of bits, that has a finite length. A data packet may comprise payload data and metadata. Payload data may be viewed as the content of a data packet while metadata may comprise additional information that is added to the payload data for technical purposes. For example, metadata may specify one or more functional units as the intended receiver units of the data packet, for routing the data packet to the intended receiver units.

Metadata may also comprise information for enabling the receiver unit to verify that it has received the payload data correctly. For instance, the metadata may comprise a cyclic redundancy check (CRC) sum computed by the sender unit on the basis of the payload data prior to sending the data packet. A sender unit may be arranged to re-compute the CRC sum on the basis of the received payload data and compare it to the CRC sum contained in the metadata of the respective data packet. A mismatch between the original CRC sum and the recomputed CRC sum may indicate that the received payload data differs from the sent payload data. Metadata may also comprise, for example, a number of the respective data packet. More specifically, a sender unit may be arranged to number the data packets which it is about to send in accordance with a certain scheme, e.g., consecutively, and to include the thus determined number of a data packet in the metadata of the respective data packet. A receiver unit may thus be enabled to verify whether it has received all data packets of a given sequence of data packets and whether it received the data packets in the correct order. Consecutive numbering of messages is implemented, for example, in the PROFIsafe system described in "PROFIsafe System Description, Technology and Application". A drawback of consecutive numbering may, however, be that the consecutive number included in each data packet may contribute to the total amount of data that is sent to the receiver unit, possibly requiring a higher data rate or bandwidth of the data link between the receiver unit and the sender unit.

SUMMARY OF THE INVENTION

The present invention provides a system-on-chip and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
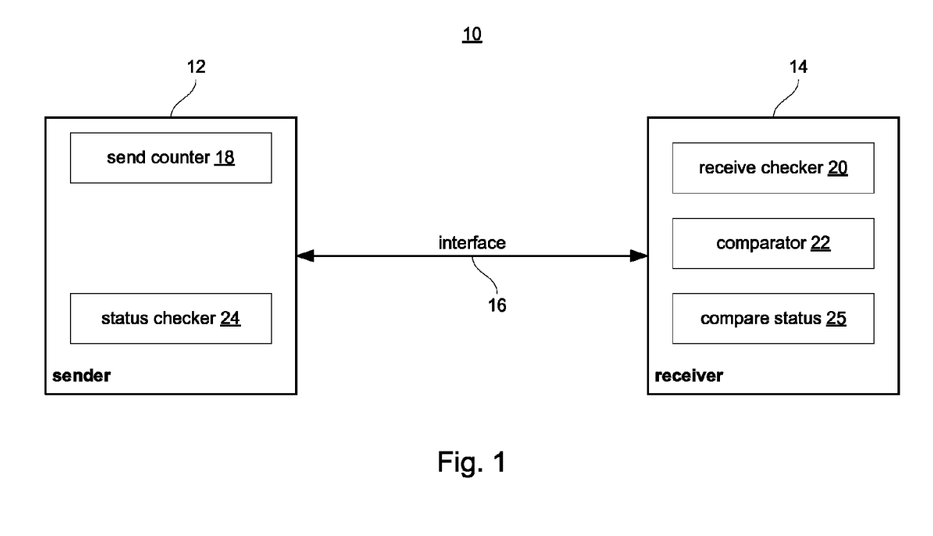
FIG. 1 schematically shows an example of an embodiment of a system-on-chip.

FIG. 1 schematically illustrates an example of a system-on-chip 10 which comprises a sender unit 12 and a receiver unit 14. The SoC 10 may comprise further functional units (not shown) in addition to the sender unit 12 and the receiver unit 14. The sender unit 12 may, for example, be a CPU or an instance of a program executed by the CPU. The receiver unit 14 may, for example, be another CPU, another instance of a program, or an integrated peripheral (IP). The sender unit 12 and the receiver unit 14 may be interconnected by a communication interface 16, e.g., a data bus. Further functional units (not shown) may be connected to the data bus. The sender unit 12 comprises a send counter 18 for providing a send counter value.

The receiver unit 14 comprises a receive counter 20 for providing a receiver counter value. The system-on-chip 10 may be arranged to set the send counter value and the receive counter value to a common initial value in response to a counter initialization signal. In one example, the sender unit 12 may be arranged to perform an initialization operation which comprises sending the send counter value to the receiver unit 14. The receiver unit 14 may be arranged to perform an initialization response operation in response to the initialization operation. The initialization response operation comprises setting the receive counter value to the send counter value. The send counter value and the receive counter value may thus be synchronized. That is, the receive counter value may be initialized so that it is equal to the send counter value. The initialization operation may, for example, be performed in an initial phase of operating the system-on-chip 10, for instance, when booting or rebooting an operating system of the system-on-chip 10.

The sender unit may be arranged to perform a send operation and the receiver unit may be arranged to perform a receive operation in response to the send operation. The send operation may comprise incrementing the send counter value by an increment and sending a data packet to the receiver unit 14. The receive operation may comprise receiving the data packet and incrementing the receive counter value by the increment. The send counter value and the receive counter value may thus be incremented by the same increment when the sender unit 12 sends a data packet to the receiver unit 14 and the receiver unit 14 receives the data packet. The send counter 18 and the receive counter 20 may thus remain synchronized.

The sender unit 12 may further be arranged to perform a challenge operation which comprises sending the send counter value to the receiver unit 14. The receiver unit 14 may be arranged to perform a challenge response operation in response to the challenge operation. The challenge response operation may comprise: receiving the send counter value, comparing the send counter value against the receive counter value, and generating a comparison result. The comparison result may be indicative of whether or not the receive counter value and the send counter value are identical. Any difference between the send counter value and the receive counter value may be an indication that an error has occurred.

There may be at least two possible causes for such an error. Firstly, a difference between the send counter value and the receive counter value may arise if the send operation or the receive operation is not successful. In this case, the send counter value may be incremented, but no corresponding data packet is received by the receiver unit 14. The send counter value but not the receive counter value may thus be incremented, resulting in a mismatch between the send counter value and the receive counter value. Secondly, a difference between the send counter value and the receive counter value may also arise if the receiver unit 14 receives an unexpected data packet from a third functional unit (see FIGS. 3 and 4 described below). In this case the receive counter value but not the send counter value may be incremented. The proposed scheme may allow detecting both types of possible errors, namely loss of a data packet from the sender unit 12 as well as reception of an unexpected data packet from a third functional unit.

It is pointed out that the send counter value does not need to be transmitted with or included in every data packet. Rather, it may be sufficient to send the send counter value to the receiver unit 14 only as part of a challenge operation which does not need to be performed after each send operation. For example, the sender unit may be arranged to perform a next challenge operation, which is a challenge operation subsequent to a first challenge operation, only with performing two or more send operations after the first challenge operation. In other words, the sender unit may be arranged to carry out the following operations in this order: a first challenge operation, two or more send operations, and a second challenge operation. In other words, the sender unit 12 may be arranged to perform the challenge operation in response to a critical number reaching a challenge-triggering data packet number, wherein the critical number is a number of data packets sent by the sender unit 12 to the receiver unit 14 since a preceding challenge operation. The challenge-triggering data packet number may be programmable. Notably, the challenge-triggering data packet number may be greater or equal two.

In another example, the sender unit 12 may be arranged to perform a challenge operation not depending on any send operations but as a function of time, e.g., periodically. For example, the sender unit 12 may be arranged to perform a challenge operation periodically with a period consisting of a fixed number of clock cycles. In other words, the sender unit 12 may be arranged to perform a challenge operation in response to a number of clock cycles since a preceding challenge operation reaching a challenge-triggering clock cycle number. The challenge-triggering clock cycle number may notably be greater than one. The challenge-triggering clock cycle number may, for example, be greater or equal 2, 4, 8, 16, or greater than that, possible much greater than that. For example, the sender unit 12 may comprise a challenge trigger unit (not shown), for triggering the sender unit to perform a challenge operation. The challenge trigger unit may, for example, comprise a wrap-around counter that is incremented with each new clock cycle, thereby triggering a challenge operation periodically. The overhead for sending data packets from the sender unit 12 to the receiver unit 14 may thus be reduced compared to a scheme in which a send counter value, or a consecutive number, is transmitted with each send operation.

The send counter 18 and the receive counter 20 may be wrap-around counters having the same maximum count. The send counter 18 and the receive counter 20 may, for example, be implemented as wrap-around counters having the same number of digits. It may thus be ensured that when the send counter 18 wraps around in a certain send operation, the receive counter 20 will wrap around in the subsequent receive operation performed by the receiver unit in response to the send operation, assuming that the send counter value and the receive counter value were identical before the send operation and the read operation and that no other, e.g., unexpected, data packet is received by the sender unit in the meantime. In other words, it may be ensured that in the absence of errors, the send counter and the receive counter wrap around together so that the send counter value and the receive counter value remain identical. A fairly small number of digits may be sufficient for the send counter and the receive counter, respectively. For example, the send counter 18 and the receive counter 20 may each have 3, 4, 5, or 6 binary digits.

Figure 2:
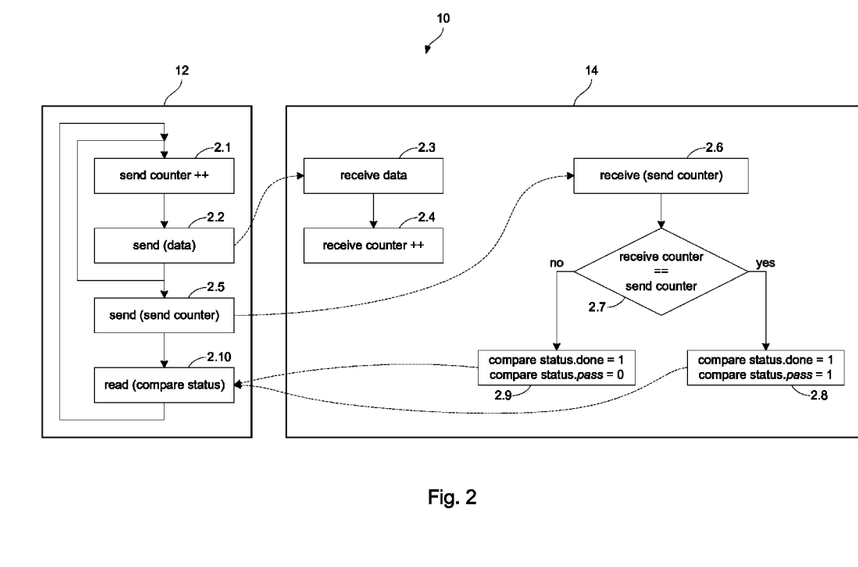
FIG. 2 schematically shows an example of an embodiment of a data packet transmission scheme.

FIG. 2 schematically illustrates an example of a method for sending data from a sender unit 12 to a receiver unit 14, comprising: operating a send counter 18 in the sender unit to provide a send counter value; operating a receive counter 20 in the receiver unit to provide a receive counter value; operating the sender unit to perform a send operation (boxes 2.1-2.2), wherein the send operation comprises incrementing the send counter value by an increment (2.1) and sending a data packet to the receiver unit (2.2); in response to the send operation, operating the receiver unit to perform a receive operation (boxes 2.3-2.4), wherein the receive operation comprises receiving the data packet (2.3) and incrementing the receive counter value by the increment (2.4); operating the sender unit to perform a challenge operation, wherein the challenge operation comprises sending the send counter value to the receiver unit (2.5); in response to the challenge operation, operating the receiver unit to perform a challenge response operation, wherein the challenge response operation comprises: receiving the send counter value (2.6), comparing the send counter value against the receive counter value (2.7), and generating a comparison result (2.8, 2.9) which is indicative of whether or not the receive counter value and the send counter value are identical.

In the example, when a data packet is to be sent from the sender unit 12 to the receiver unit 14, the sender unit 12 increments the send counter value provided by its send counter (box 2.1). The sender unit 12 then sends the data packet (box 2.2) to the receiver unit 14. The receiver unit 14 may receive the data packet (box 2.3) and, in response to receiving the data packet, increment the receive counter value provided by its receive counter (box 2.4). The sender unit 12 may send a challenge to the receiver unit 14, which comprises the current send counter value (box 2.5). The receiver unit 14 may receive the send counter value from the sender unit 12 (box 2.6). The receiver unit 14 may then compare the send counter value (received from the sender unit 12) and the receive counter value (provided by the receive counter 20). If the receive counter value and the send counter value are equal, the receiver unit 14 may change a first flag, referred to herein as compare status done flag, from 0 to 1 and a second flag, referred to herein as the compare status pass flag, to 1 (box 2.8). If, however, the receive counter value and the send counter value differ, the receiver unit 14 may change the compare status done flag from 0 to 1 and set the compare status pass flag to 0. The compare status done flag may indicate whether the comparison (box 2.7) has been terminated or not. More specifically, the compare status done flag being 1 may indicate that the comparison (box 2.7) has been done and, accordingly, that a comparison result is available. In the example, the comparison result may be indicated by the compare status pass flag. Namely, the compare status pass flag being 1 may indicate that the receive counter value equals the send counter value, whereas the compare status flag being 0 may indicate that the receive counter value differs from the send counter value. The sender unit 12, in response to detecting that the compare status done flag is 1, may read the compare status pass flag from the receiver unit 14 and may take an appropriate action in dependence of the value of the compare status pass flag. For instance, when the compare status pass flag is 1, i.e., when the receive counter value equals the send counter value, the sender unit 12, may for example, take no particular action. If, however, the compare status pass flag is 0, the sender unit 12 may, for example, generate an error signal or restart a current process or reboot.

As mentioned above, the challenge operation (box 2.5) is not necessarily performed after each send operation (box 2.2). The data overhead involved with each data packet may thus be reduced and bandwidth of the data link between the sender unit 12 and the receiver unit 14 may be saved. In other words, the sender unit 12 may carry out two or more, possibly a very large number of, send operations (boxes 2.1 and 2.2) before it sends a next challenge (2.5) to the receiver unit 14, as illustrated in the figure by the loop from box 2.2 back to box 2.1. The above described operations (boxes 2.1 to 2.9) may be performed repeatedly, as illustrated by the loop from box 2.10 back to box 2.1.

Figure 3:
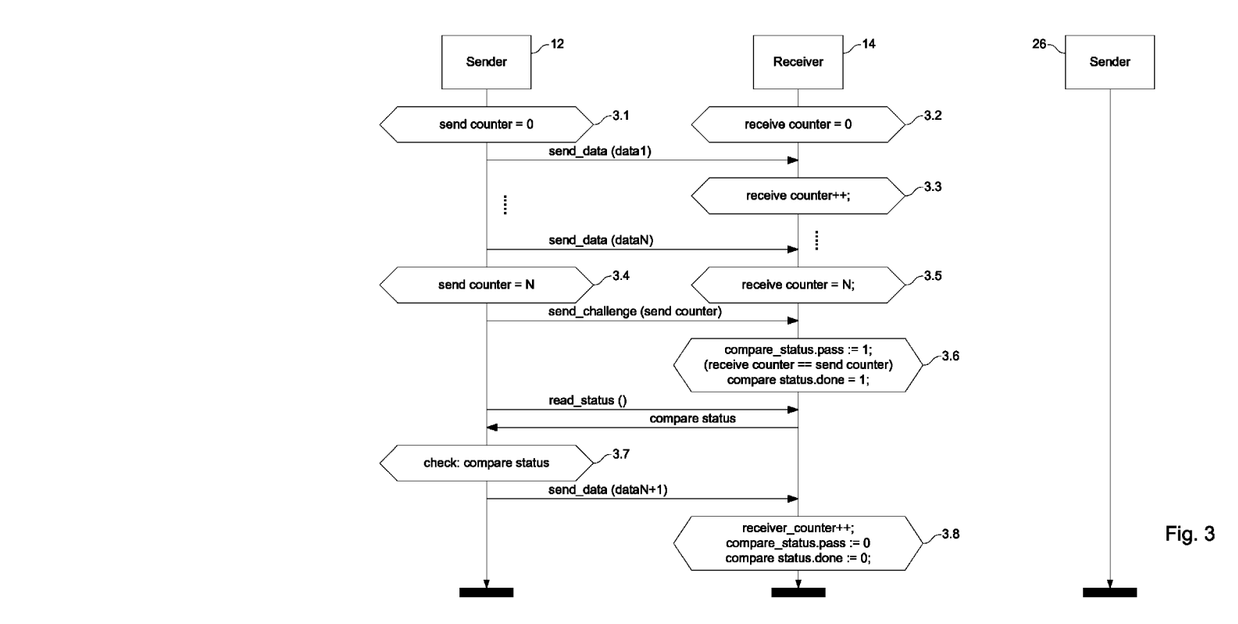
FIG. 3 schematically shows a first example of a sequence of operations performed by a sender unit and a receiver unit.

Referring now to FIG. 3, a first possible sequence of operations is explained by way of an example. In the example, the SoC 10 comprises a third functional unit 26. The third functional unit 26 may be capable of sending data packets to the receiver unit 14. The third functional unit 26 may therefore be referred to as a second sender unit 26. When the second sender unit 26 sends a data packet to the receiver unit 14 while the first sender unit 12 is busy sending a sequence of data packets to the receiver unit 14, a problem may arise in that the receiver unit 14 may misinterpret a data packet from the second sender unit 26 as a data packet from the first sender unit 12. This problem may in principle be avoided by operating the sender units 12 and 26 such that they do not send streams of data packets to the receiver unit 14 concurrently. However, in practice it may happen, for example, that a data stream generated by the second sender unit 26 is erroneously addressed not to an intended receiver unit (not shown) but to the receiver unit 14. Also, it may occur that the second sender unit 26 misses a signal indicating that the sender unit 12 is busy sending data to the receiver unit 14. The method described above in reference to FIG. 2 may enable the sender unit 12 to detect reception of an intermittent data packet from the other sender unit 26, as will be illustrated by an example below in reference to FIG. 4. Present FIG. 3 illustrates an example of a scenario in which the second sender unit 26 does not interfere with the sender unit 12.

More specifically, in the example scenario of FIG. 3, the sender unit 12 may set the send counter value to an initial value (box 3.1). The initial value may, for example, be 0. Similarly, the receiver unit 14 may set the receive counter value to an initial value (box 3.2). Conveniently, the initial values of the send counter and the receive counter are identical, e.g., both may be 0.

It is noted however, that the method may, in principle, be implemented using different initial values for the send counter and the receive counter. The send counter and the receive counter then have an initial difference which needs to be accounted for when the two counter values are compared (in box 3.6 described below). Since an implementation in which the send counter and the receive counter have different initial values may be equivalent to the mathematically simpler implementation in which they are identical, only this latter implementation will be considered in the following. I.e., it is assumed in the following that the send counter value and the receive counter value are set to identical initial values (boxes 3.1 and 3.2).

The sender unit 12 may then send a sequence of one or more data packets to the receiver unit 14 and increment the send counter value by 1 with each data packet that is sent. The receiver unit 14 may receive the data packets from the sender unit 12 in the order in which they were sent and increment the receive counter value by 1 (box 3.3) with each received data packet. Accordingly, when the sender unit 12 has sent a sequence of N data packets and the receiver unit 14 has received the sequence of N data packets from the sender unit 12, the send counter value may be N (box 3.4) and the receive counter value may be N as well (box 3.5). In the example, none of the data packets from the sender unit 12 comprises any number assigned to the respective data packet which would indicate the position of the data packet in the sequence of N data packets. The total amount of data sent from the sender unit 12 to the receiver unit 14 may thus be reduced.

The sender unit 12, in response to, e.g., the send counter value reaching the value N or in response to, e.g., lapse of a predefined time, may send a challenge to the receiver unit 14. Sending the challenge may comprise sending the current send counter value N to the receiver unit 14. The receiver unit 14, in response to the challenge from the sender unit 12, may compare the send counter value from the sender unit 12 to the receive counter value and generate a corresponding comparison result (box 3.6). Generating the comparison result (box 3.6) may notably comprise changing the compare status done flag from 0 to 1. Generating the comparison result (box 3.6) may further comprise setting the compare status pass flag to 1 if the send counter value and the receive counter value are identical and to 0 if they differ. In the example, the send counter value and the receive counter value are both N and the compare status pass flag is accordingly set to 1, thereby indicating that the two counter values are identical. The sender unit 12 may further read the compare status done flag and, in response to detecting that the compare status done flag is 1, further read the compare status pass flag. The sender unit 12 may then check (box 3.7) whether the compare status pass flag is 1. In response to detecting that the compare status pass flag is 1, the sender unit 12 may proceed with sending further data packets to the receiver unit 14. The receiver unit 14, in response to receiving a next data packet, may increment the receive counter value by 1 and reset both the compare status pass flag and the compare status done flag to 0 (box 3.8). A new cycle comprising operations similar to the ones described above with reference to boxes 3.3 to 3.8 may then be performed.

Figure 4:
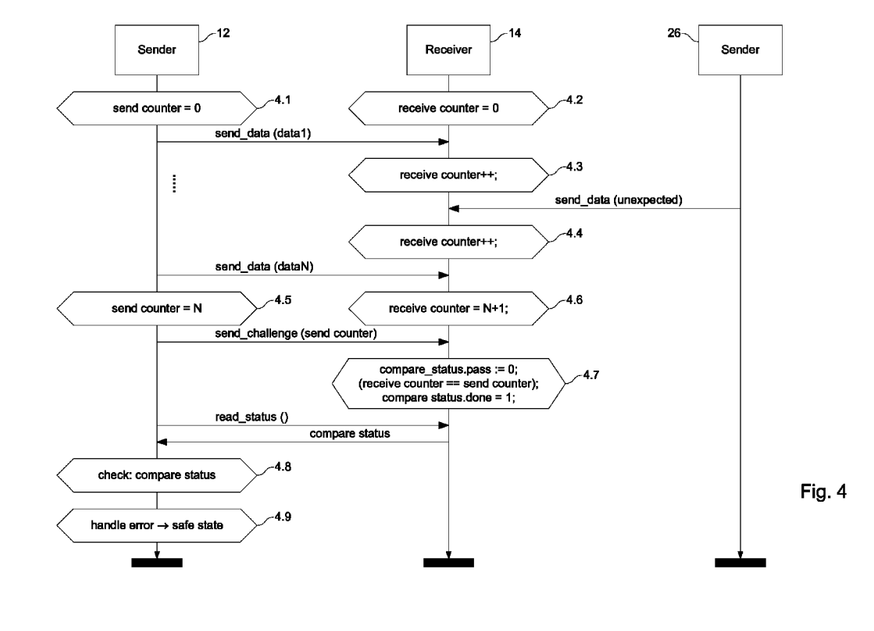
FIG. 4 schematically shows a second example of a sequence of operations performed by the sender unit and the receiver unit.

Referring now to FIG. 4, a variant of the scenario described above with reference to FIG. 3 is described. In the example, the send counter value and the receive counter value may first be initialized (boxes 4.1 and 4.2) in the same manner as described above with reference to FIG. 3. The sender unit 12 may then transmit a sequence of N data packets to the receiver unit 14. The receiver unit 14 may receive the data packets and increment the receive counter value accordingly (box 4.3).

At a certain moment, the second sender unit 26 may send a data packet to the receiver unit 14, although the sender unit 12 has not yet finished sending its sequence of data packets to the receiver unit 14. The data packet from the second sender unit 26 may be referred to as an unexpected data packet. In the example, the receive counter of the receiver unit 14 may be incapable of discriminating between data packets from different sender units. More specifically, the receive counter may be arranged to increment the receive counter value in response to any received data packet, irrespective of the sender unit from which the data packet was dispatched. Accordingly, the receiver unit 14 may increment the receive counter value by 1 in response to the unexpected data packet (box 4.4). Therefore, when the receiver unit 14 has received the N data packets from the sender unit 12 and the unexpected data packet from the sender unit 26, the send counter value of the sender unit 12 and the receive counter value of the receiver unit 14 may be N and N+1, respectively. The receive counter value being greater than the send counter value may be an indication that the receiver unit 14 has received one or more unexpected data packets.

The sender unit 12 may send a challenge to the receiver unit 14 in response to a challenge-triggering event. The challenge-triggering event may be an event of the kind described above with reference to FIG. 3, e.g., the send counter value reaching the value N or lapse of a predefined time. The value N, that is the number of data packets sent by the sender unit 12 to the receiver unit 14 after which the sender unit 12 sends a challenge to the receiver unit 14, may notably be 2 or more than 2, thereby achieving a reduction in the amount of data sent by the sender unit 12.

The receiver unit 14, in response to receiving the challenge from the sender unit 12, may generate a comparison result (box 4.7, analogous to box 3.6 in FIG. 3). However, the compare status pass flag may now be set to 0 because the send counter value (N in the example) and the receive counter value (N+1 in the example) now differ. The compare status done flag may be changed from 0 to 1 to indicate that a comparison result has been generated (box 4.7).

The sender unit 12 may read the compare status done flag and, in response to detecting that the compare status done flag is 1, verify whether the compare status pass flag is 1 (box 4.8). In the example, the compare status pass flag is not 1 but 0, indicating that the receive counter value and the send counter value were found to be different. The sender unit 12, in response to detecting that the compare status pass flag is not 1, may initiate an error handling action (box 4.9). The error handling action may comprise, for example, generating a signal for setting the system-on-chip 10, or parts thereof, in a safe state. A large variety of other error handling actions may be devised in dependence of the particular design of the SoC 10.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may, for example, be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. For example, the operations represented by boxes 2.1 and 2.2 may be combined. Also, the operations represented by boxes 2.3 and 2.4 may be combined.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A system-on-chip, SoC, comprising a sender unit and a receiver unit, wherein
the sender unit comprises a send counter for providing a send counter value;
the receiver unit comprises a receive counter for providing a receive counter value;
the sender unit is arranged to perform a send operation, wherein the send operation comprises incrementing the send counter value by an increment and sending a data packet to the receiver unit; and
the receiver unit is arranged to perform a receive operation in response to the send operation, wherein the receive operation comprises receiving the data packet and incrementing the receive counter value by the increment;
the sender unit is arranged to perform a challenge operation, wherein the challenge operation comprises sending the send counter value to the receiver unit; and
the receiver unit is arranged to perform a challenge response operation in response to the challenge operation, wherein the challenge response operation comprises: receiving the send counter value, comparing the send counter value against the receive counter value, and generating a comparison result which is indicative of whether or not the receive counter value and the send counter value are identical.

2. The system-on-chip of claim 1, arranged to set the send counter value and the receive counter value to a common initial value in response to a counter initialization signal.

3. The system-on-chip of claim 1, wherein
the sender unit is arranged to perform an initialization operation which comprises sending the send counter value to the receiver unit and
the receiver unit is arranged to perform an initialization response operation in response to the initialization operation, wherein the initialization response operation comprises setting the receive counter value to the send counter value.

4. The system-on-chip of claim 1, wherein the send counter and the receive counter are wrap-around counters and have a same maximum count.

5. The system-on-chip of claim 1, wherein the sender unit is arranged to perform the challenge operation in response to a critical number reaching a challenge-triggering data packet number, wherein the critical number is a number of data packets sent by the sender unit to the receiver unit since a preceding challenge operation.

6. The system-on-chip of claim 5, wherein the challenge-triggering data packet number is programmable.

7. The system-on-chip of claim 5, wherein the challenge-triggering data packet number is greater or equal two.

8. The system-on-chip of claim 1, wherein the sender unit is arranged perform the challenge operation in response to a number of clock cycles since a preceding challenge operation reaching a challenge-triggering clock cycle number.

9. The system-on-chip of claim 1, wherein the sender unit is a central processing unit or an instance of a program executed by a central processing unit, and the receiver unit is an integrated peripheral.

10. A method for sending data from a sender unit to a receiver unit, comprising:

operating a send counter in the sender unit to provide a send counter value;

operating a receive counter in the receiver unit to provide a receive counter value;

operating the sender unit to perform a send operation, wherein the send operation comprises incrementing the send counter value by an increment and sending a data packet to the receiver unit;

in response to the send operation, operating the receiver unit to perform a receive operation, wherein the receive operation comprises receiving the data packet and incrementing the receive counter value by the increment;

operating the sender unit to perform a challenge operation, wherein the challenge operation comprises sending the send counter value to the receiver unit; and in response to the challenge operation, operating the receiver unit to perform a challenge response operation, wherein the challenge response operation comprises: receiving the send counter value, comparing the send counter value against the receive counter value, and generating a comparison result which is indicative of whether or not the receive counter value and the send counter value are identical.

* * * * *